United States Patent
Huang et al.

(10) Patent No.: US 8,916,400 B2
(45) Date of Patent: Dec. 23, 2014

(54) MANUFACTURING METHOD FOR AN LED COMPRISING A NITRIDED ALN REFLECTING LAYER

(75) Inventors: Chia-Hung Huang, Hsinchu (TW); Shih-Cheng Huang, Hsinchu (TW); Po-Min Tu, Hsinchu (TW); Shun-Kuei Yang, Hsinchu (TW); Ya-Wen Lin, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 101 days.

(21) Appl. No.: 13/457,431

(22) Filed: Apr. 26, 2012

(65) Prior Publication Data
US 2013/0032779 A1 Feb. 7, 2013

(30) Foreign Application Priority Data
Aug. 1, 2011 (CN) .......................... 2011 1 0217796

(51) Int. Cl.
*H01L 33/10* (2010.01)
*H01L 33/00* (2010.01)
*H01L 21/768* (2006.01)
*H01L 33/22* (2010.01)

(52) U.S. Cl.
CPC ........ *H01L 33/007* (2013.01); *H01L 21/76856* (2013.01); *H01L 33/0075* (2013.01); *H01L 33/10* (2013.01); *H01L 33/22* (2013.01)
USPC .......... 438/29; 438/47; 257/98; 257/E33.068; 257/E33.072

(58) Field of Classification Search
CPC ............ H01L 21/76856; H01L 33/007; H01L 33/0075; H01L 33/10; H01L 33/22
USPC ......... 257/13, 98, E33.068, E33.072; 438/29, 438/47
See application file for complete search history.

(56) References Cited

U.S. PATENT DOCUMENTS

| | | | |
|---|---|---|---|
| 2001/0050376 A1* | 12/2001 | Shibata et al. | 257/190 |
| 2002/0014629 A1 | 2/2002 | Shibata | |
| 2006/0154392 A1 | 7/2006 | Tran et al. | |
| 2007/0241352 A1* | 10/2007 | Yasuda et al. | 257/94 |
| 2008/0105881 A1* | 5/2008 | Kim et al. | 257/76 |
| 2009/0127583 A1* | 5/2009 | Ohachi et al. | 257/190 |

FOREIGN PATENT DOCUMENTS

TW  200705709 A  2/2007

* cited by examiner

*Primary Examiner* — Tom Thomas
*Assistant Examiner* — Christopher M Roland
(74) *Attorney, Agent, or Firm* — Novak Druce Connolly Bove + Quigg LLP

(57) ABSTRACT

A light emitting diode (LED) comprises a substrate, an epitaxial layer and an aluminum nitride (AlN) layer sequentially disposed on the substrate. The AlN layer comprises a plurality of stacks separated from each other, wherein the epitaxial layer entirely covers the plurality of stacks of the AlN layer. The AlN layer with a plurality of stacks reflects upwardly light generated by the epitaxial layer and downwardly toward the substrate to an outside of LED through a top plan of the LED. A method for forming the LED is also disclosed.

8 Claims, 6 Drawing Sheets

MANUFACTURING METHOD FOR AN LED COMPRISING A NITRIDED ALN REFLECTING LAYER

TECHNICAL FIELD

The disclosure relates to light emitting diodes and manufacturing methods, and more particularly to a high efficiency light emitting diode and a manufacturing method thereof.

DESCRIPTION OF THE RELATED ART

Light emitting diodes (LEDs) have low power consumption, high efficiency, quick reaction time, long lifetime, and the absence of toxic elements such as mercury during manufacturing. Due to those advantages, traditional light sources are gradually replaced by LEDs. LEDs are capable of converting electrons into photons to emit radiant light at a certain spectrum out of the LEDs. The LEDs each contain a substrate for disposing a light emitting layer. However, a portion of radiant light emitted from the light emitting layer may be absorbed by the substrate, which is located under the light emitting layer. Such that, a light emitting intensity of the LED may be reduced. Hence, a new designed LED that overcomes aforementioned deficiencies is required.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Exemplary embodiments of the disclosure will be described with reference to the accompanying drawings.

Figure 1:
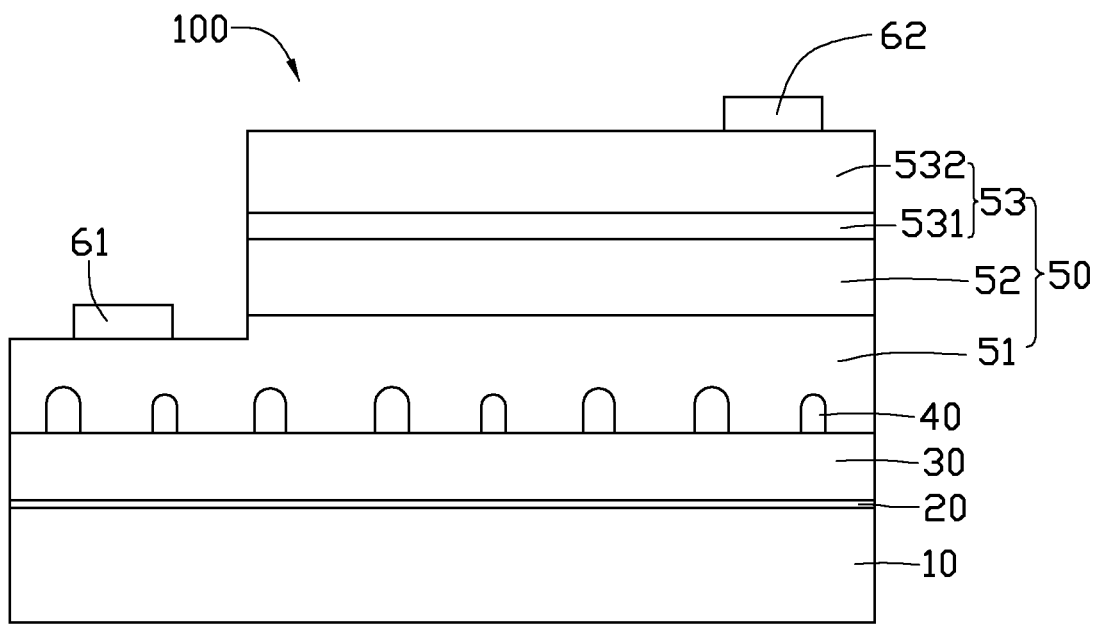
FIG. 1 is a cross section of an LED of the disclosure.

Referring to FIG. 1, the disclosure provides an LED 100 comprising a substrate 10, a buffer layer 20 disposed on the substrate 10, a transitional layer 30 disposed on the buffer layer 20, an aluminum nitride (AlN) layer 40 disposed on the transitional layer 30, and an epitaxial layer 50 disposed on the AlN layer 40 and the transitional layer 30.

In the embodiment, the substrate 10 is made from sapphire ($Al_2O_3$). Alternatively, the substrate 10 also can be formed from silicon carbide (SiC), silicon or gallium nitride (GaN).

The buffer layer 20 and the transitional layer 30 are sequentially disposed on the substrate 10, by which, deficiencies formed in the AlN layer 40 and the epitaxial layer 50 due to lattice mismatch can be reduced. For the same reason, lattice constants of the buffer layer 20 and the transitional layer 30 are close to lattice constants of the AlN layer 40 and the epitaxial layer 50. In the embodiment, un-doped GaN or N-type GaN can make the buffer layer 20 and the transitional layer 30.

The AlN layer 40 is composed of a plurality of stacks separated from each other, wherein the transitional layer 30 extends to the epitaxial layer 50 through intervals between the pluralities of stacks of the AlN layer 40. In the embodiment, the plurality of stacks of the AlN layer 40 is formed as a semi-sphere structure; alternatively, it also can be a pyramid or a cylindrical structure.

The epitaxial layer 50 comprises a first semiconductor layer 51, a light emitting layer 52 and a second semiconductor 53 sequentially disposed on the AlN layer 40 and the transitional layer 30. The epitaxial layer 50 entirely covers the pluralities of stacks of the AlN layer 40, and connects with the transitional layer 30 via the intervals between the pluralities of stacks of the AlN layer 40. In the embodiment, the first semiconductor layer 51 is an N-type GaN layer, the light emitting layer 52 is a multiple quantum well (MQW) GaN/InGaN layer, and the second semiconductor layer 53 is a P-type GaN layer. Moreover, the second semiconductor layer 53 comprises a P-type blocking layer 531 on the light emitting layer 52 and a P-type contacting layer 532 on the P-type blocking layer 531. Furthermore, the P-type blocking layer 531 can be composed of P-type aluminum gallium nitride (AlGaN), and the P-type contacting layer 532 can be composed of P-type GaN. When electrons inside the first semiconductor layer 51 jump to electric holes inside the second semiconductor layer 53 by excitation of an electric field, photons are emitted from the light emitting layer 52 where the conjunctions of the electrons and the electric holes occur. The plurality of stacks of the AlN layer 40 reflects a portion of radiant light emitted from the light emitting layer 52 facing the substrate 10, and then directs the radiant light out of the LED 100 in a normal direction, which is directly out of a top plan of the LED 100. Thus, a light emitting efficiency of the LED 100 can be enhanced.

A first electrode 61 is disposed on a portion of the first semiconductor layer 51 exposed to a top surface of the LED 100. A second electrode 62 is disposed on a top surface of the second semiconductor layer 53. The first and the second electrodes 61, 62 direct an inducting current into and out of the LED 100 for producing the electric field. In the embodiment, the first electrode 61 is a cathode and the second electrode 62 is an anode. Moreover, a transparent conductive layer (not shown) can be formed between the second electrode 62 and the second semiconductor layer 53 for evenly inducting current into the LED 100. Indium tin oxide (ITO) or an alloy of nickel and gold (Ni/Au) can make the transparent conductive layer.

Figure 2:
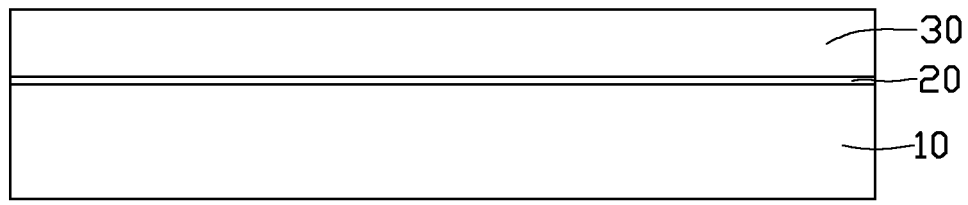
FIG. 2 is a cross section showing a step of providing a substrate, a buffer layer and a transitional layer sequentially disposed on the substrate in accordance with a manufacturing method for an LED of the disclosure.

The disclosure provides a manufacturing method for the LED 100, comprising following steps:

As shown in FIG. 2, a substrate 10 is provided. In the embodiment, the substrate 10 is sapphire ($Al_2O_3$). Alternatively, the substrate 10 also can be made of SiC, silicon or GaN.

Thereafter, a buffer layer 20 and a transitional layer 30 are sequentially formed on the substrate 10. Un-doped GaN or N-type GaN, which can be made by metal-organic chemical vapor deposition (MOCVD), molecular beam epitaxy (MBE) or hydride vapor phase epitaxy (HVPE), can make the buffer layer 20 and the transitional layer 30.

Figure 3:
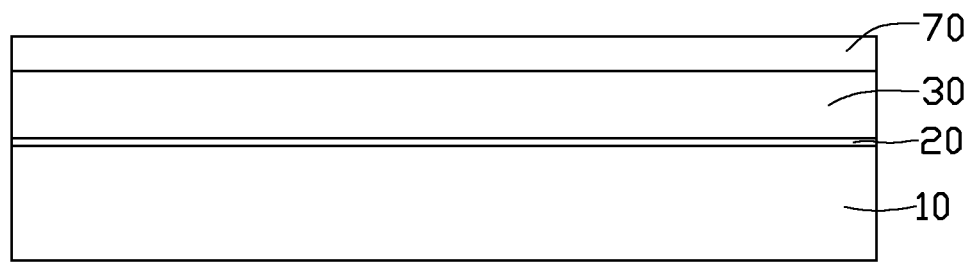
FIG. 3 is a cross section showing a step of coating an aluminum layer on the transitional layer in accordance with the manufacturing method for the LED of FIG. 2.

Referring to FIG. 3, an aluminum layer 70 is coated on the transitional layer 30. In the embodiment, the aluminum layer 70 can be formed by vapor deposition vapor deposition, evaporation or sputtering.

Figure 4:
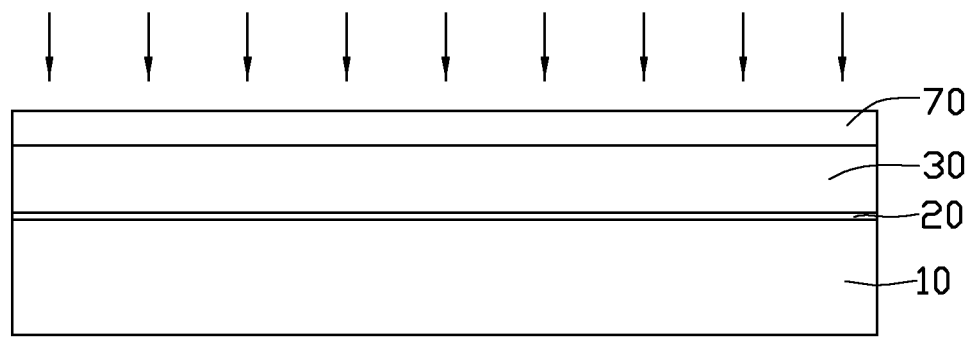
FIG. 4 and FIG. 5 are cross sections showing steps of forming the aluminum nitride layer with a plurality of stacks on the transitional layer in accordance with the manufacturing method for the LED of FIG. 3.
Figure 5:
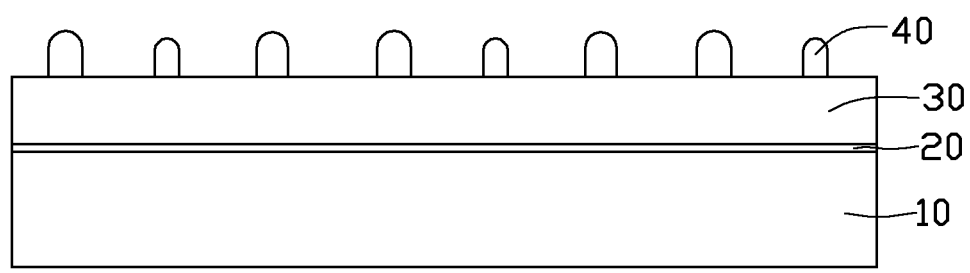

Referring to FIG. 4 and FIG. 5, an aluminum nitride (AlN) layer 40 with a plurality of stacks on the transitional layer 30 is formed by using nitriding process on the aluminum layer 70. In the embodiment, the nitriding process is achieved by MOCVD. Alternatively, the nitriding process also can be achieved by another method, wherein the aluminum layer 70 is heated at a temperature of approximately 660° C., and then ammonia (NH$_3$) gas is infused over the aluminum layer 70. Thereby, the aluminum layer 70 is formed into a plurality of stacks under this ambient temperature and combines with NH$_3$ to become AlN compound. Thus, the AlN layer 40 with the plurality of stacks on the transitional layer 30 is formed. The transitional layer 30 is exposed to a top surface of the AlN layer 40 through intervals between the pluralities of stacks. In the embodiment, the plurality of stacks of AlN layer 40 each is formed as a semi-sphere structure at a diameter of 20-40 nm; alternatively, the stack also can be formed as a pyramid or a cylindrical structure.

Figure 6:
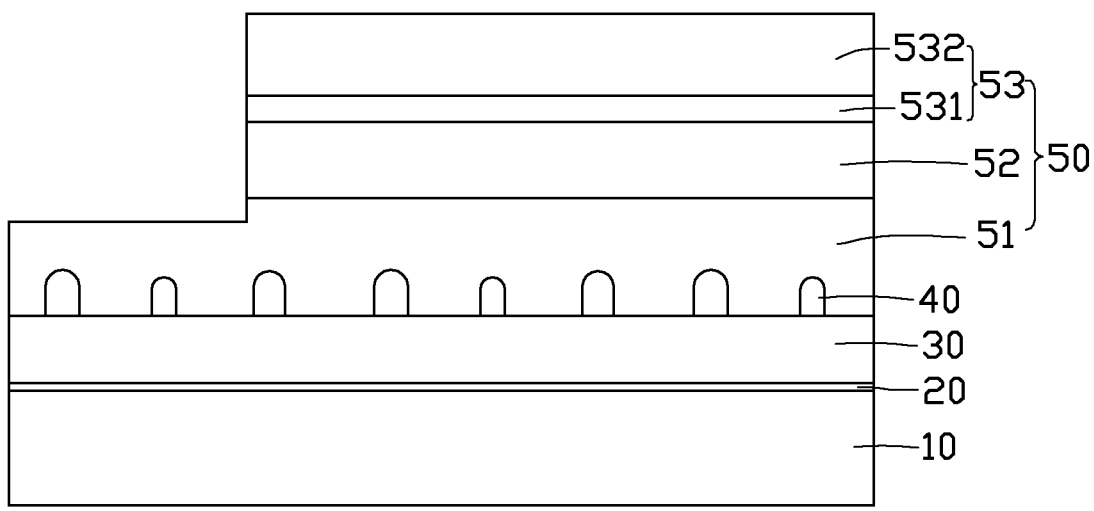
FIG. 6 is a cross section showing a step of forming an epitaxial layer on the aluminum nitride layer in accordance with the manufacturing method for the LED of FIG. 5.

Referring to FIG. 6, an epitaxial layer 50 is formed on the AlN layer 40 and the transitional layer 30, wherein the epitaxial layer 50 comprises a first semiconductor layer 51, a light emitting layer 52, and a second semiconductor layer 53 sequentially disposed on the AlN layer 40 and the transitional layer 30. The epitaxial layer 50 can be formed by MOCVD, MBE, or HYPE. In the embodiment, the first semiconductor layer 51 entirely covers the plurality of stacks of AlN layer 40 and connects to the transitional layer 30 through the intervals of the plurality of stacks of the AlN layer 40. The epitaxial layer 50 can be made of GaN, wherein the first semiconductor layer 51 is an N-type GaN layer, the light emitting layer 52 is a MQW GaN layer, the second semiconductor layer 53 is a P-type GaN layer. The second semiconductor layer 53 can further comprise a P-type blocking layer 531 on the light emitting layer 52 and a P-type contacting layer 532 on the P-type blocking layer 531. In the embodiment, the P-type blocking layer 531 is made of AlGaN and the P-type contacting layer 532 is made of GaN.

Referring to FIG. 1, a first electrode 61 and a second electrode 62 are respectively formed on the first semiconductor layer 51 and the second semiconductor layer 53. Vapor deposition or sputter can be used to form the first and the second electrodes 61, 62. Moreover, the first electrode 61 and second electrode 62 can be titanium, aluminum, silver, nickel, tungsten, copper, palladium, chromium, gold or an alloy thereof.

Furthermore, for providing an inducting current evenly flowing into the LED 100, a transparent conductive layer (not shown) can be disposed between the second electrode 62 and the second semiconductor layer 53. ITO or Ni/Au alloy can be used to form the transparent conductive layer.

Accordingly, the disclosure provides the LED 100 comprising the plurality of stacks of the AlN layer 40, wherein radiant light emitted downwardly from the light emitting layer 52 can be reflected by the stacks of the AlN layer 40 upwardly toward the normal direction in the plane view of the LED 100. Therefore, a light extraction from the LED 100 and the light intensity thereof are increased. Moreover, lateral sides of each of the plurality of stacks of the AlN layer 40 are arched or oblique that the radiant light reflected from the AlN layer 40 has a larger incidence angle to direct into the first semiconductor layer 51. Hence, total reflections inside the LED 100 can be reduced that the light extraction and the light intensity of the LED 100 are enhanced further.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A manufacturing method for an LED (light emitting diode), comprising the following steps:
   providing a substrate;
   sequentially disposing a buffer layer and a transitional layer on the substrate;
   coating an aluminum layer on the transitional layer;
   using a nitriding process on the aluminum layer to form an aluminum nitride (AlN) layer with a plurality of stacks separated from each other and on the transitional layer, wherein the transitional layer is exposed to an epitaxial layer through intervals between the plurality of stacks of the AlN layer;
   disposing the epitaxial layer on the AlN layer and the transitional layer, wherein the epitaxial layer comprises a first semiconductor layer, a light emitting layer and a second semiconductor layer; and
   forming a first electrode and a second electrode respectively on the first semiconductor layer;
   wherein the AlN layer is configured for reflecting light generated by the epitaxial layer facing the substrate.

2. The manufacturing method for the LED as claimed in claim 1, wherein the substrate is sapphire (Al2O3), silicon carbide (SiC), silicon or gallium nitride (GaN).

3. The manufacturing method for the LED as claimed in claim 1, wherein the buffer layer, the transitional layer and the epitaxial layer are made by metal-organic chemical vapor deposition (MOCVD), molecular beam epitaxy (MBE) or hydride vapor phase epitaxy (HVPE).

4. The manufacturing method for the LED as claimed in claim 1, wherein the aluminum layer is formed by vapor deposition, evaporation or sputtering.

5. The manufacturing method for the LED as claimed in claim 1, wherein the nitriding process is made by MOCVD.

6. The manufacturing method for the LED as claimed in claim 1, wherein in the to of using the nitriding process on the aluminum layer to form the AlN layer with the plurality of stacks separated from each other and on the transitional layer, the aluminum layer is heated at a temperature of approximately 660° C., and then ammonia (NH3) gas is infused over the aluminum layer.

7. The manufacturing method for the LED as claimed in claim 1, wherein the first and the second electrodes are made by vapor deposition or sputter.

8. The manufacturing method for the LED as claimed in claim 1, wherein a transparent conductive layer is formed between the second electrode and the second semiconductor layer.

* * * * *